US009661707B2

(12) United States Patent
Meiser et al.

(10) Patent No.: US 9,661,707 B2
(45) Date of Patent: May 23, 2017

(54) METHOD FOR MANUFACTURING A SEMICONDUCTOR DEVICE USING TILTED ION IMPLANTATION PROCESSES, SEMICONDUCTOR DEVICE AND INTEGRATED CIRCUIT

(71) Applicant: Infineon Technologies AG, Neubiberg (DE)

(72) Inventors: Andreas Meiser, Sauerlach (DE); Till Schloesser, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/138,739

(22) Filed: Apr. 26, 2016

(65) Prior Publication Data
US 2016/0322357 A1    Nov. 3, 2016

(30) Foreign Application Priority Data

Apr. 29, 2015    (DE) .................... 10 2015 106 689

(51) Int. Cl.
*H01L 29/66*  (2006.01)
*H05B 33/08*  (2006.01)
(Continued)

(52) U.S. Cl.
CPC ......... *H05B 33/083* (2013.01); *H01L 21/266* (2013.01); *H01L 21/26513* (2013.01); *H01L 21/26586* (2013.01); *H01L 21/823814* (2013.01); *H01L 21/823821* (2013.01); *H01L 27/0924* (2013.01); *H01L 29/0847* (2013.01); *H01L 29/1095* (2013.01); *H01L 29/41766* (2013.01); *H01L 29/4236* (2013.01)

(58) Field of Classification Search
CPC ............ H05B 33/083; H01L 21/26513; H01L 21/26586; H01L 21/266; H01L 21/823814; H01L 21/823821; H01L 27/0924; H01L 29/1095; H01L 29/41766; H01L 29/4236
See application file for complete search history.

(56) References Cited

U.S. PATENT DOCUMENTS

| | | | |
|---|---|---|---|
| 2007/0187682 A1 | 8/2007 | Takeuchi et al. | |
| 2007/0190708 A1 | 8/2007 | Kaneko et al. | |
| 2015/0091083 A1 | 4/2015 | Poelzl et al. | |

FOREIGN PATENT DOCUMENTS

| | | |
|---|---|---|
| DE | 112006001589 T5 | 4/2008 |
| WO | 2013095779 A1 | 6/2013 |

*Primary Examiner* — Elias M Ullah
(74) *Attorney, Agent, or Firm* — Murphy, Bilak & Homiller, PLLC

(57) ABSTRACT

A semiconductor device includes first and second field effect transistors (FETs) formed in a semiconductor substrate having a first main surface. The first FET includes first source and drain contact grooves, each running in a first direction parallel to the first main surface, each formed in the first main surface. First source regions are electrically connected to a conductive material in the first source contact groove. First drain regions are electrically connected to a conductive material in the first drain contact groove. The second FET includes second source and drain contact grooves, each running in a second direction parallel to the first main surface, each formed in the first main surface. Second source regions are electrically connected to a conductive material in the second source contact groove, and second drain regions are electrically connected to a conductive material in the second drain contact groove.

10 Claims, 11 Drawing Sheets

(51) Int. Cl.
*H01L 29/417* (2006.01)
*H01L 29/08* (2006.01)
*H01L 29/10* (2006.01)
*H01L 29/423* (2006.01)
*H01L 21/8238* (2006.01)
*H01L 21/265* (2006.01)
*H01L 21/266* (2006.01)
*H01L 27/092* (2006.01)

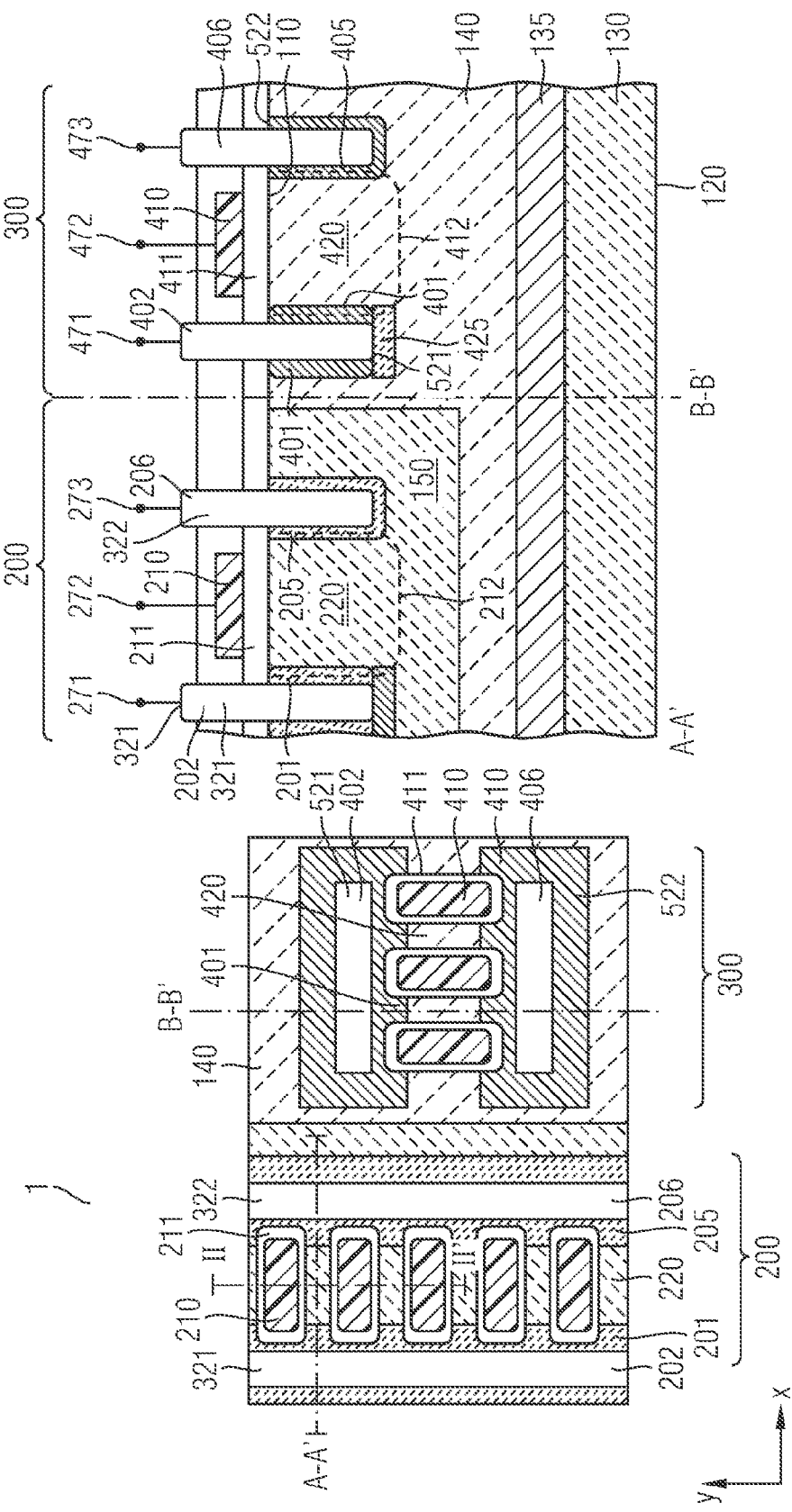

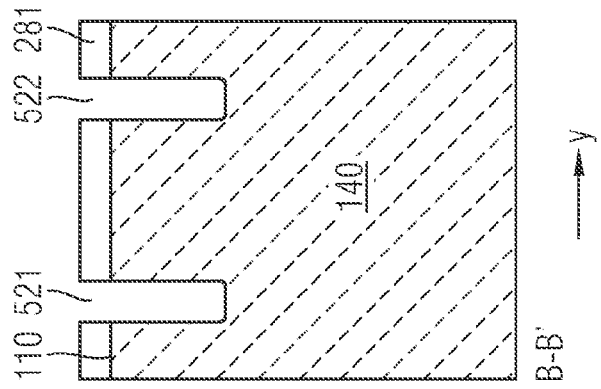
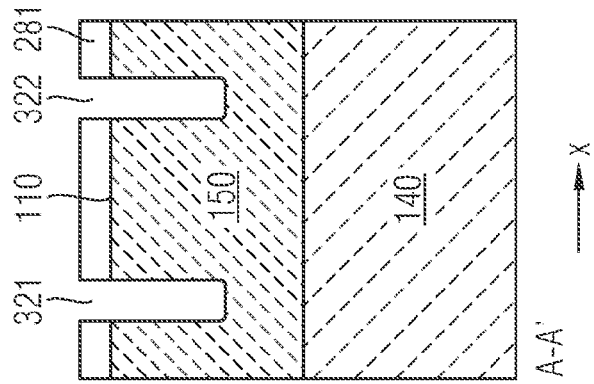
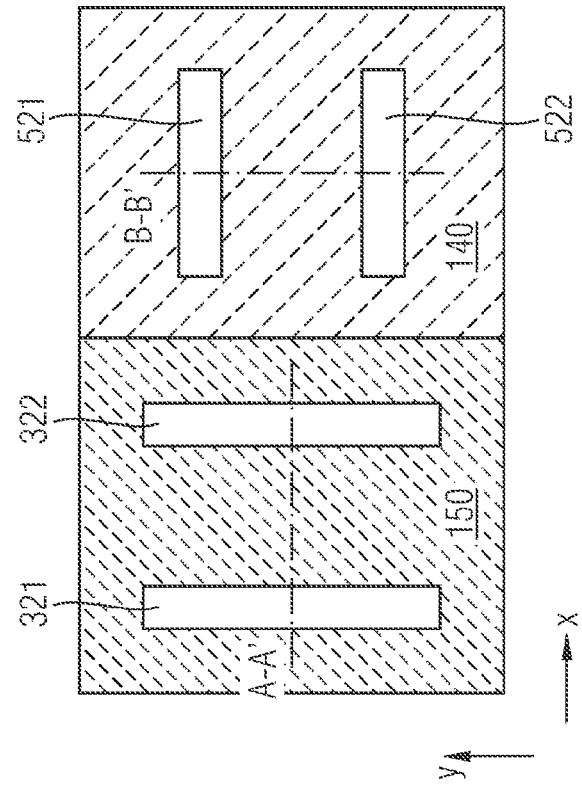

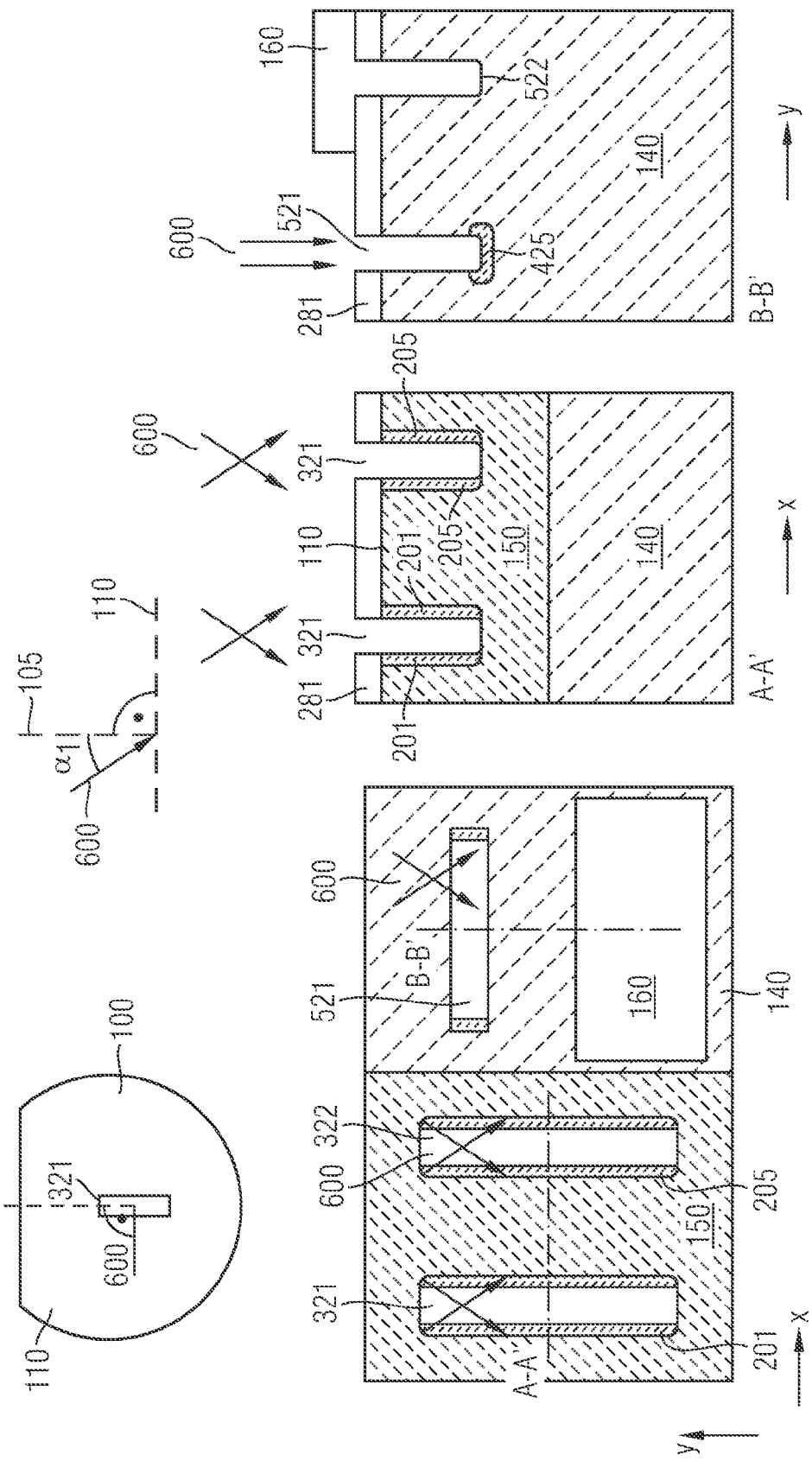

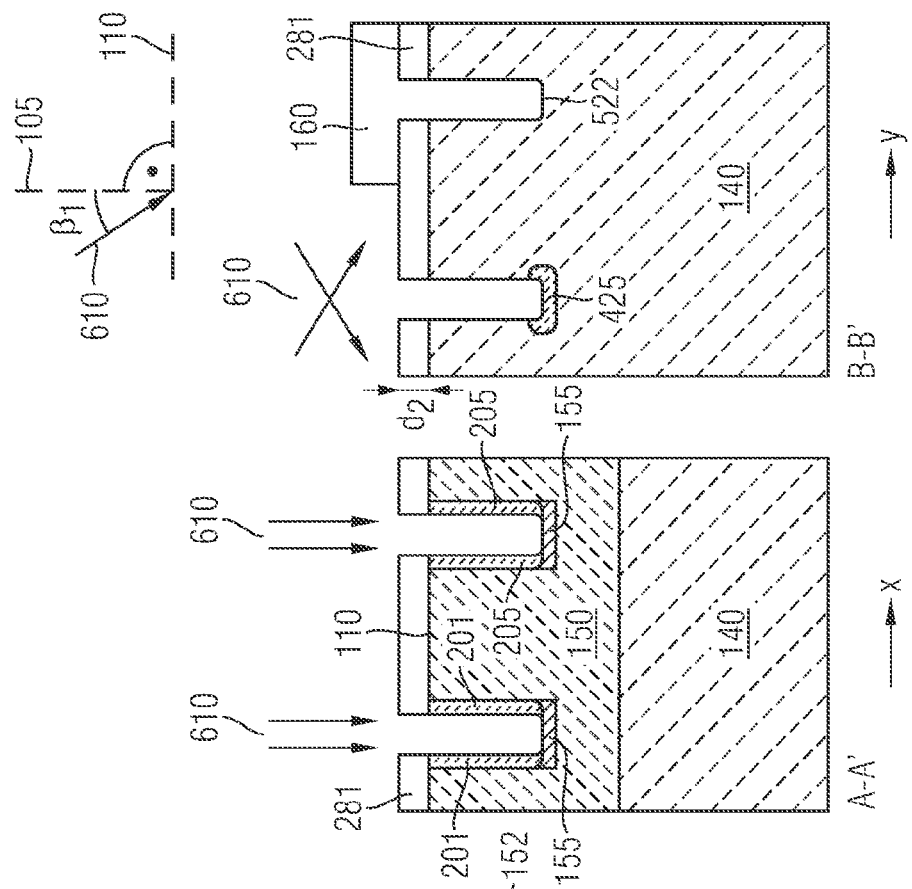
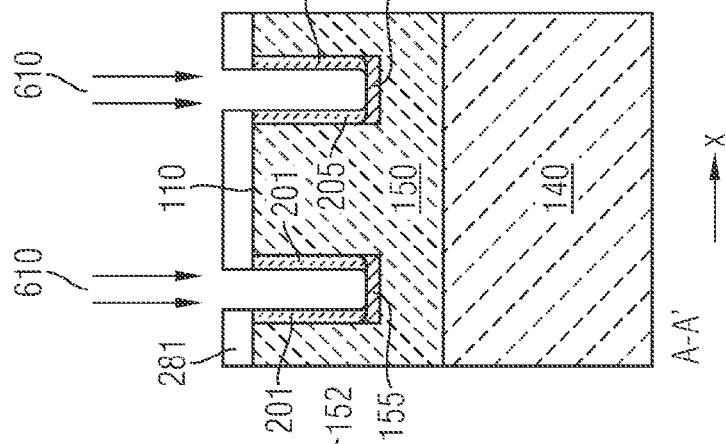
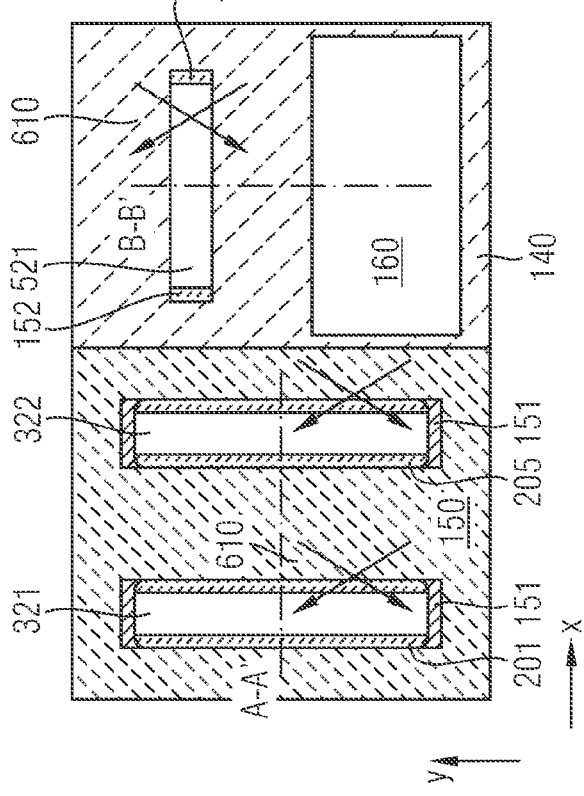

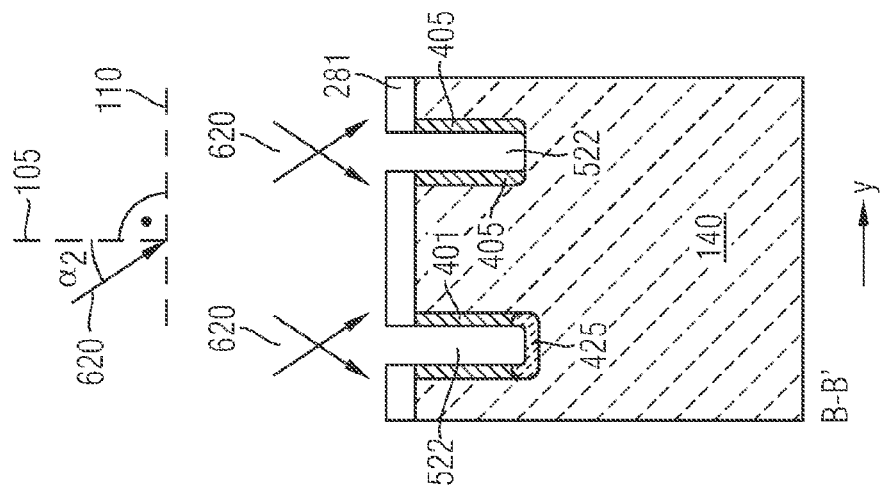
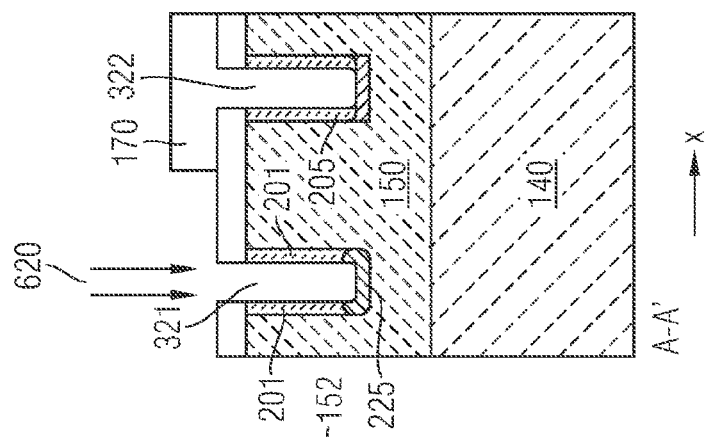
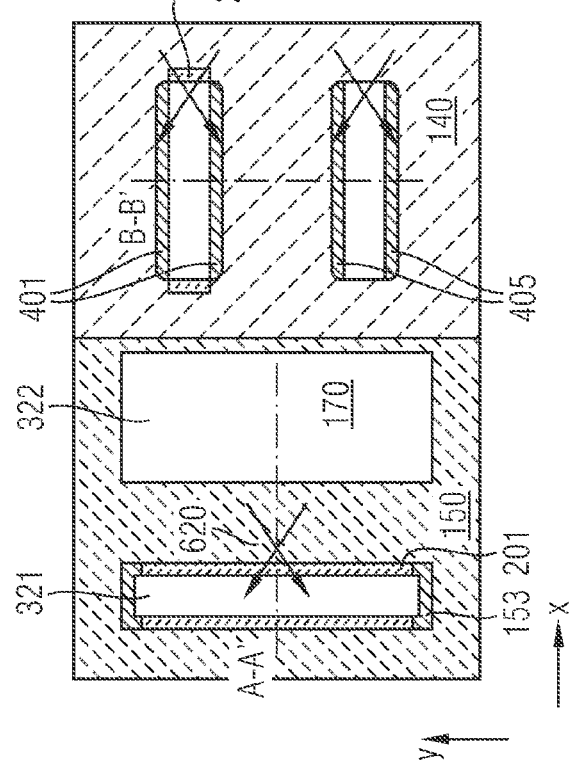

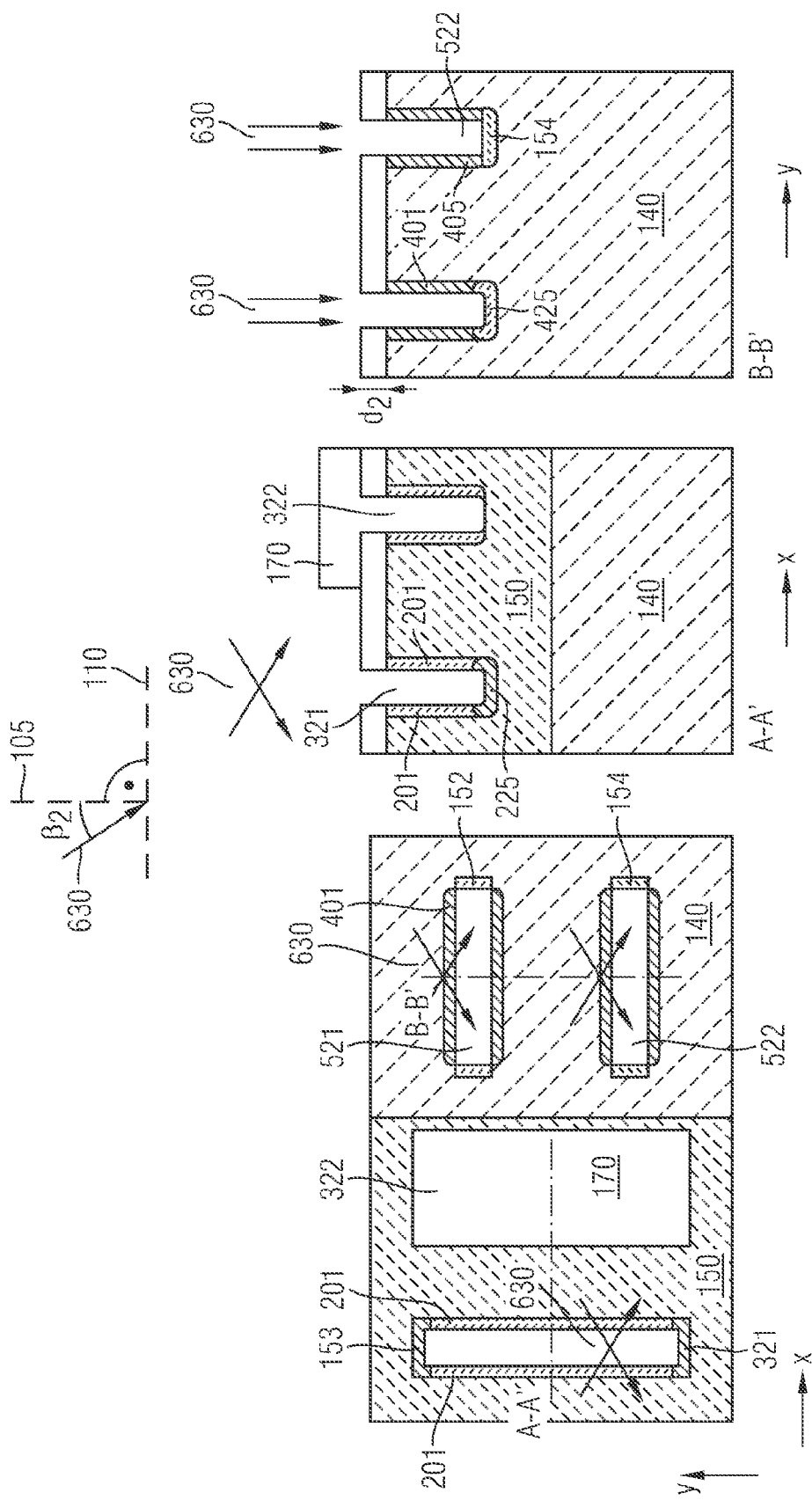

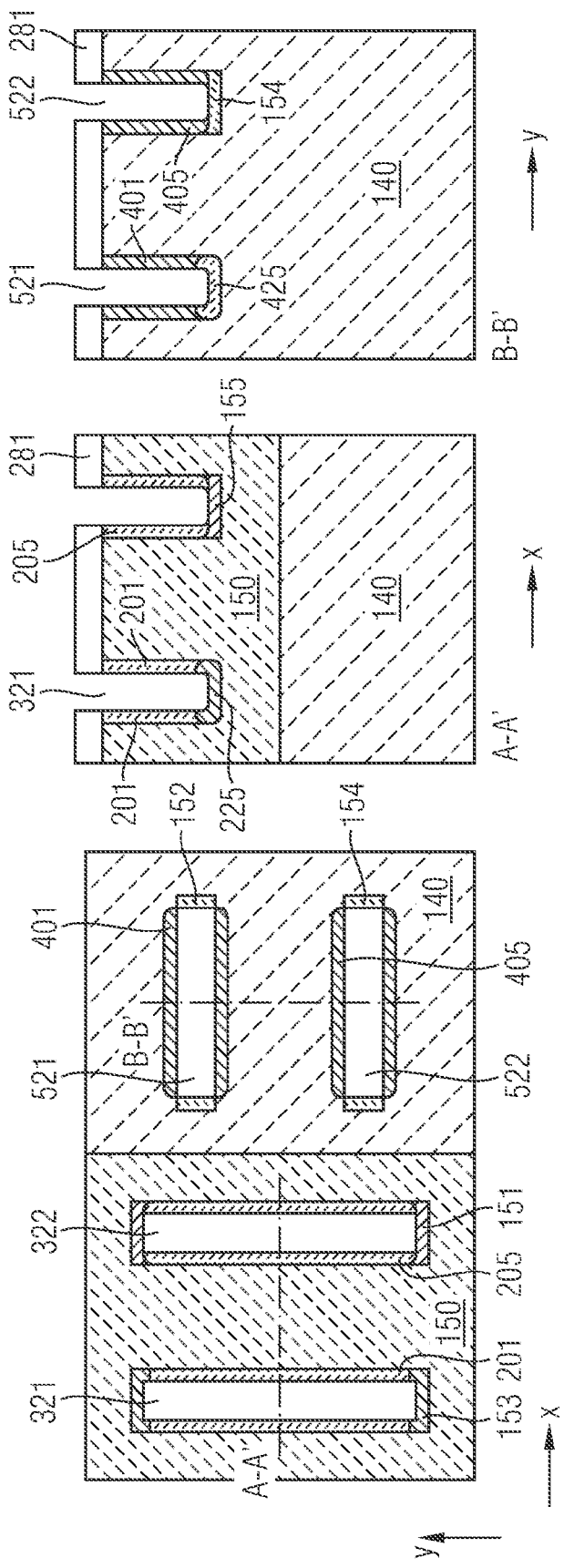

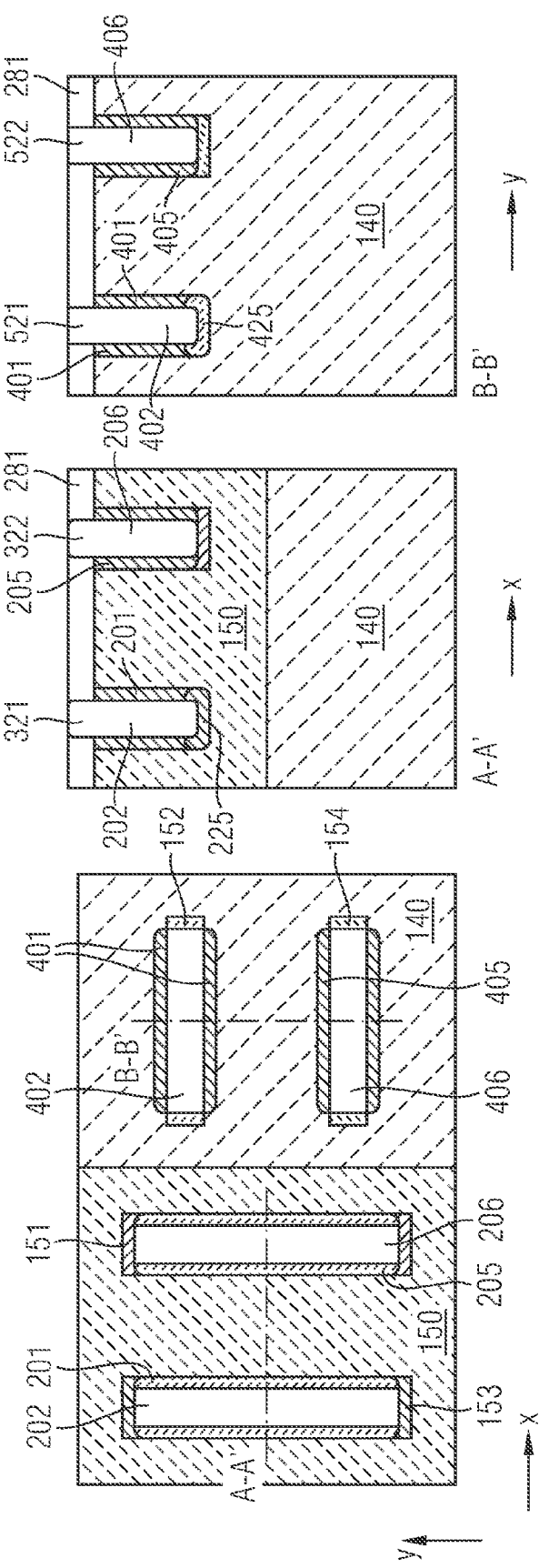

METHOD FOR MANUFACTURING A SEMICONDUCTOR DEVICE USING TILTED ION IMPLANTATION PROCESSES, SEMICONDUCTOR DEVICE AND INTEGRATED CIRCUIT

PRIORITY CLAIM

This application claims priority to German Patent Application No. 10 2015 106 689.0 filed on 29 Apr. 2015, the content of said application incorporated herein by reference in its entirety.

BACKGROUND

Power transistors commonly employed in automotive and industrial electronics require a low on-state resistance ($R_{on} \cdot A$), while securing a high voltage blocking capability. For example, a MOS ("metal oxide semiconductor") power transistor should be capable, depending upon application requirements, to block drain to source voltages $V_{ds}$ of some tens to some hundreds or thousands of volts. MOS power transistors typically conduct very large currents which may be up to some hundreds of Amperes at typical gate-source voltages of about 2 to 20 V.

Lateral power devices, in which a current flow mainly takes place parallel to a first main surface of a semiconductor substrate, are useful for integrated circuits in which further components, such as switches, bridges and control circuits are integrated. According to concepts, lateral power devices may be implemented as a power FinFET, in which the gate electrode may be disposed in gate trenches and may pattern the body region into the shape of a ridge. According to these concepts, source contacts and drain contacts may extend in the semiconductor substrate. It may be desirable to integrate n-channel and p-channel power MOSFETs into one single semiconductor substrate. Accordingly, concepts for further simplifying such a manufacturing process are investigated.

SUMMARY

It is an object of the present invention to provide a method of forming a semiconductor device comprising a first field effect transistor and a second field effect transistor which may be further simplified and which may reduce cost. Further, it is an object to provide a semiconductor device that may be manufactured by such a method and a corresponding integrated circuit.

According to an embodiment, a semiconductor device comprises a first field effect transistor and a second field effect transistor, each formed in a semiconductor substrate having a first main surface. The first field effect transistor includes a first source contact groove and a first drain contact groove, each running in a first direction parallel to the first main surface, each being formed in the first main surface. The first field effect transistor further comprises first source regions of the first conductivity type electrically connected to a conductive material in the first source contact groove and first drain regions of the first conductivity type electrically connected to a conductive material in the first drain contact groove. The second field effect transistor includes a second source contact groove and a second drain contact groove, each running in a second direction parallel to the first main surface, the second direction being different from the first direction, each being formed in the first main surface, second source regions of the second conductivity type electrically connected to a conductive material in the second source contact groove and second drain regions electrically connected to a conductive material in the second drain contact groove.

According to an embodiment, a method of forming a semiconductor device comprising a first field effect transistor and a second field effect transistor (300) in a semiconductor substrate having a first main surface comprises forming a first source contact groove and a first drain contact groove, each running in a first direction parallel to the first main surface, in the first main surface. The method further comprises forming a second source contact groove and a second drain contact groove, each running in a second direction parallel to the first main surface, in the first main surface, the second direction being different from the first direction. The method further comprises performing a first tilted ion implantation process with dopants of the first conductivity type, the first tilted ion implantation process being performed in a first implantation direction, a projection of the first implantation direction on the first main surface being perpendicular to the first direction, the first implantation direction having a first tilt angle with respect to a normal to the first main surface, so as to introduce dopants through first sidewalls of the first source contact groove and the first drain contact groove into the semiconductor substrate, the first sidewalls extending in the first direction. The method further comprises performing a second tilted ion implantation process with dopants of the second conductivity type, the second tilted ion implantation process being performed at a second implantation direction, a projection of the second implantation direction on the first main surface being perpendicular to the second direction, the second implantation direction having a second tilt angle with respect to the normal to the first main surface, so as to introduce dopants through second sidewalls of the second source contact groove and the second drain contact groove into the semiconductor substrate, the second sidewalls extending in the second direction.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIGS. 1A, 1B and 1C show cross-sectional views of elements of an embodiment of a semiconductor device.

FIGS. 2A to 2C show cross-sectional views of a semiconductor substrate when performing the method according to an embodiment.

FIGS. 3A to 3C show cross-sectional views of a substrate after performing an ion implantation step.

FIGS. 4A to 4C illustrate cross-sectional views of the substrate when performing a further ion implantation step.

FIGS. 5A to 5C show cross-sectional views of the substrate when performing a further ion implantation step.

FIGS. 6A to 6C show further cross-sectional views of the substrate when performing still a further ion implantation step.

FIGS. 7A to 7C show cross-sectional views of the substrate after removing mask layers and performing a rapid thermal annealing step.

FIGS. 8A to 8C show examples of a substrate after filling a conductive material in the grooves.

DETAILED DESCRIPTION

Figure 1C:
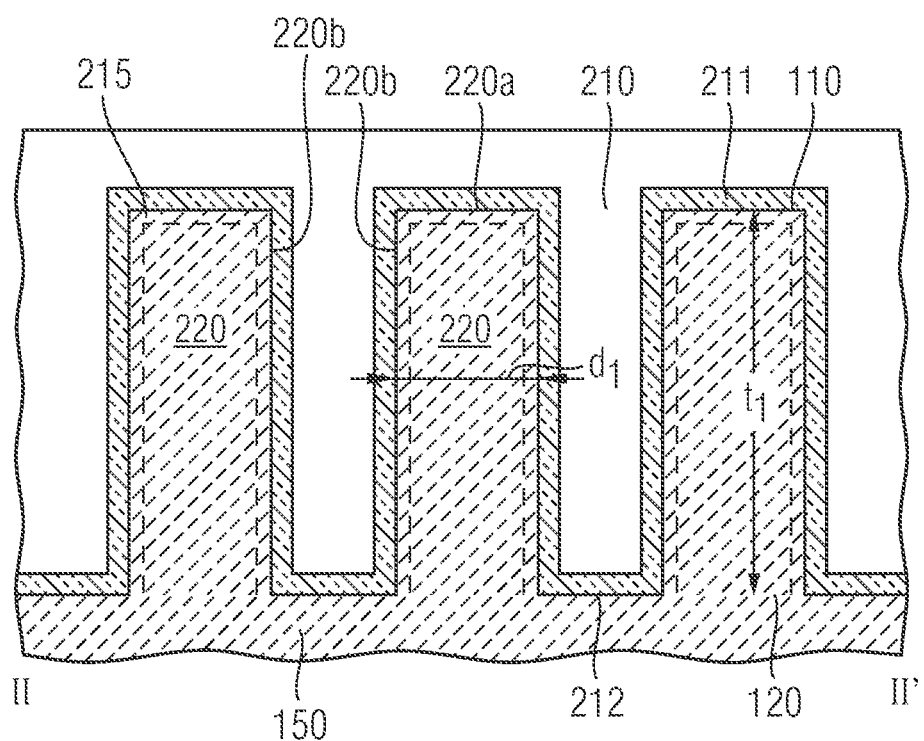

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

The Figures and the description illustrate relative doping concentrations by indicating "−" or "+" next to the doping type "n" or "p". For example, "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

The present specification refers to a "first" and a "second" conductivity type of dopants, semiconductor portions are doped with. The first conductivity type may be p type and the second conductivity type may be n type or vice versa. As is generally known, depending on the doping type or the polarity of the source and drain regions, insulated gate field effect transistors (IGFETs) such as metal oxide semiconductor field effect transistors (MOSFETs) may be n-channel or p-channel MOSFETs. For example, in an n-channel MOSFET, the source and the drain region are doped with n-type dopants. In a p-channel MOSFET, the source and the drain region are doped with p-type dopants. As is to be clearly understood, within the context of the present specification, the doping types may be reversed. If a specific current path is described using directional language, this description is to be merely understood to indicate the path and not the polarity of the current flow, i.e. whether the current flows from source to drain or vice versa. The Figures may include polarity-sensitive components, e.g. diodes. As is to be clearly understood, the specific arrangement of these polarity-sensitive components is given as an example and may be inverted in order to achieve the described functionality, depending whether the first conductivity type means n-type or p-type.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

FIG. 1A shows a horizontal cross-sectional view of a semiconductor device 1 according to an embodiment. The semiconductor device 1 comprises a first field effect transistor 200 and a second field effect transistor 300. Each of the first field effect transistor 200 and the second field effect transistor 300 are formed in a semiconductor substrate 100 having a first main surface 110 (shown in FIG. 1B). The first field effect transistor 200 comprises a first source contact groove 321 and a first drain contact groove 322, each running in a first direction (e.g. the y direction) parallel to the first main surface. A conductive material is formed in the first source contact groove 321 to form a first source contact 202. Further, a conductive material is formed in the first drain contact groove 322 to form a first drain contact 206.

The first source contact groove 321 and the first drain contact groove 322 are formed in the first main surface 110. The first field effect transistor 200 further comprises first gate electrode structures 210 and first body regions 220, extending between the first source contact groove 321 and the first drain contact groove 322. The first gate electrode structures 210 and the first body regions 220 may be alternatingly disposed along the first direction. First source regions 201 of the first conductivity type are electrically connected to the conductive material in the first source contact grooves 321 implementing the first source contact 202. First drain regions 205 of the first conductivity type are electrically connected to the first drain contact 206.

The second field effect transistor 300 comprises a second source contact groove 521 and a second drain contact groove 522, each running in a second direction (e.g. the x direction) parallel to the first main surface. The second direction is different from the first direction. For example, the second direction may be perpendicular to the first direction. A conductive material is formed in the second source contact groove 521 to form the second source contact 402. Further, a conductive material is formed in the second drain contact groove 522 to form the second drain contact 406.

The second source contact groove and the second drain contact groove are each formed in the first main surface 110. The second field effect transistor further comprises second gate electrode structures 310 and second body regions 320 which extend between the second source contact groove and the second drain contact groove 522. Second source regions 401 of the second conductivity type are electrically connected to the second source contacts 402. Further, second drain regions 405 are electrically connected to the second drain contacts 406.

FIG. 1B shows a vertical cross-sectional view of the semiconductor device according to an embodiment. The left-hand portion of FIG. 1B shows the cross-sectional view along the line A-A', whereas the right-hand portion of FIG. 1B shows the cross-sectional view along the line B-B'. Accordingly, the right-hand portion of FIG. 1B extends along the first direction, and the left-hand portion of FIG. 1B extends along the second direction. The left-hand portion of FIG. 1B is a cross-sectional view of the first field effect transistor 200, and the right-hand portion of FIG. 1B is a cross-sectional view of the second field effect transistor 300. The semiconductor device is formed in a semiconductor substrate 100. According to an embodiment, the semiconductor substrate 100 may comprise a base layer 130 of the second conductivity type, followed by a second layer 140 of the first conductivity type. The second layer 140 of the first conductivity type may be epitaxially grown over the base layer 130. A buried layer 135 doped with dopants of the first conductivity type at a higher concentration than second layer 140 may be disposed between the second layer 140 and the base layer 130. A well portion 150 of the second conductivity type may be defined within the second layer 140. The well portion 150 may be formed by a masked ion implantation step. The first field effect transistor 200 may be formed in the well portion 150 and the second field effect transistor 300 may be defined in the second layer 140.

Due to the specific configuration, according to which the semiconductor device is formed in a well portion 150 of the second conductivity type, e.g. a p-type well which is formed in the second layer 140 of the first conductivity type, leakage currents may be prevented from flowing to the substrate. Due to the presence of the buried layer 135 a higher breakdown voltage with respect to the p-doped layer 130 may be achieved. For example, when holes are injected from the substrate, the buried layer 135 protects the semiconductor device against the injection of holes.

The first field effect transistor 200 comprises a first source region 201 and a first drain region 205. A first body region 220 is disposed between the first source region 201 and the first drain region 205. The first body region 220 may be patterned into the shape of a ridge by adjacent first gate trenches 212. The ridges and the first gate trenches 212 may extend in the second direction, e.g. the x direction. The first gate trenches 212 may be filled with a conductive material, e.g. doped polysilicon or a metal material, to form a first gate electrode 210. Alternatively, also a different material may be disposed in the first gate trenches, for example, an insulating material. A gate dielectric layer 211 may be arranged between the first gate electrode 210 and the adjacent first body region 220. The first source region 201 and the first drain region 205 extend in the semiconductor substrate 100 to approximately 50 to 100% of the depth of the gate trenches 212. For example, the first source region 201 is disposed adjacent to a sidewall of a first source contact groove 321. Further, the first drain region 205 is disposed adjacent to a sidewall of a first drain contact groove 322.

A first body contact portion 225 may be disposed so as to electrically couple the first body region 220 to a first source terminal 271. For example, the first body contact portion 225 may be disposed adjacent to the first source contact groove 321. According to an embodiment, the first body contact portion 225 is disposed adjacent to a bottom side of the first source contact trench 321. As is to be clearly understood, the first body contact portion 225 may also be disposed adjacent to a sidewall of the first source contact trench 321.

The first source region 201 and the first drain region 205 may be doped with the first conductivity type. The first body region 220 may be undoped, or may be doped with the second conductivity type. The first body contact portion 225 may be doped with the second conductivity type at a higher doping concentration than the first body region 220. Due to the presence of the first body contact portions 225, a low-ohmic contact of the first body region 220 to a first source terminal 271 via the source contacts 202 is accomplished and a parasitic bipolar transistor may be deteriorated or suppressed.

The second field effect transistor 300 comprises corresponding elements as the first field effect transistor 200. The reference numerals of the components of the second field effect transistor 300 are incremented by 200 with respect to corresponding components of the first field effect transistor. Differing from the first field effect transistor, the doping types of the source region, the drain region, the body region and the body contact portion 425 are reversed. For example, the second source region 401 and the second drain region 405 may be of the second conductivity type, and the second body contact portion 425 may be of the first conductivity type.

As becomes apparent from FIG. 1B, doped portions of various doping types are present at the vertical and horizontal faces of the transistors.

FIG. 1C shows a cross-sectional view between II-II as is also illustrated in FIG. 1A. The cross-sectional view of FIG. 1C is taken so as to intersect a plurality of first gate trenches 212. As is to be clearly understood, the second field effect transistors 300 may have a similar construction but are rotated by 90° around the z-axis (axis perpendicular to the first main surface). As is illustrated, the body region 220 which forms a part of the doped well portion 150 may be patterned into isolated lamellas of semiconductor material. The isolated lamellas form the single ridges implementing the body region 220. The ridges comprise a top surface 220a and sidewalls 220b. An insulating material implementing the gate dielectric layer 211 may be disposed adjacent to the sidewalls 220b and to the top surface 220a of each of the ridges. Further, a conductive material is filled into the first gate trenches 212 between adjacent ridges to form the gate electrode 210. As has been explained, the body region 220 has the shape of a ridge extending in the second direction, or a fin. More particularly, the body region is patterned into a ridge by adjacent first gate trenches 212 that extend in the second direction.

When a suitable voltage is applied to the first gate electrode 210, the conductivity of a channel 215 that is formed in the body region 220 adjacent to the gate dielectric layer 211, will be controlled by the gate voltage. By controlling the conductivity of the channel 215 formed in the body region 220, a current flow from the first source region 201 via the channel 215 formed in the body region 220 to the first drain region 205 may be controlled. In a corresponding manner, the current flow in the second field effect transistor 300 may be controlled by controlling the gate voltage applied to the second gate electrode 410. When a voltage corresponding to an off-state is applied to the gate electrode 210, no conductive channel is formed at the boundary between the body region 220 and the insulating gate dielectric material 211 so that no current flows.

The sidewalls 220b may extend perpendicularly or at an angle of more than 75° with respect to the first main surface 110. The gate electrode 210 may be disposed adjacent to at least two sides of the ridge. Moreover, the top surface 220a and the sidewalls 220b of the ridge may not be implemented as completely straight lines. For example, the points of intersection between the top surface 220a and the sidewalls 220b may be implemented as rounded corners. Likewise, the bottom portions of the gate trenches 212 may form rounded corners to the sidewalls 220b of the ridges.

According to an embodiment, the width $d_1$ of the channel region is: $d_1 > 2 \times l_d$, wherein $l_d$ denotes a length of a depletion zone which is formed at the interface between the gate dielectric layer 211 and the body region 220. Generally, it is assumed that in a transistor, the length of the depletion zone at a gate voltage corresponding to the threshold voltage corresponds to the maximum width of the depletion zone. For example, the width of the depletion zone may be determined as:

$$l_d = \sqrt{\frac{4\varepsilon_s kT \ln(N_A/n_i)}{q^2 N_A}}$$

wherein $\varepsilon_s$ denotes the permittivity of the semiconductor material ($11.9 * \varepsilon_0$ for silicon), k denotes the Boltzmann constant ($1.38066 * 10^{-23}$ J/K), T denotes the temperature, e.g. 293K, ln denotes the natural logarithm, $N_A$ denotes the impurity concentration of the semiconductor body, $n_i$ denotes the intrinsic carrier concentration ($1.45 * 10^{10}$ for silicon at 27° C.), q denotes the elementary charge ($1.6 * 10^{-19}$ C).

In particular, the channel regions formed at opposing sidewalls 220b of a ridge may not merge with each other so that the first body region 220 may be connected to the first source contact 202 along the whole length of the first body region 220. For example, the width of the first trenches may be approximately 20 to 130 nm, for example, 40 to 120 nm along the first main surface 110 of the semiconductor substrate 100. Further, the distance between adjacent trenches that corresponds to the width $d_1$ of the ridges may be larger than 100 nm. The distance between second gate trenches of the second field effect transistor 300 may be in a similar range. Generally, the components of the second field effect transistor 300 may be similar to the components of the first field effect transistor 200, unless stated otherwise. Due to the special implementation of the first and second field effect transistors, according to which the body region has a shape of ridge, and the gate electrode may be adjacent to three sides of the ridge, a higher effective channel width and a reduced leakage current may be obtained. The suppressed leakage current may be due to the better suppressing of short channel effects. In particular, it becomes possible to increase the effective area of the transistor without increasing the area needed for constructing of the transistor.

In the following, a process will be described, by which the various doping processes may be performed while reducing the number of lithographical steps employed. Starting point for performing the method according to an embodiment, is a pre-processed semiconductor substrate 100 comprising a base layer 130 of the second conductivity type, a buried layer 135, a second layer 140 of the first conductivity type and a doped well portion 150 of the second conductivity type. The first gate trenches 212 and the second gate trenches 412 in which the first gate electrode and the second gate electrode may be disposed, respectively, may have already been formed. Nevertheless, as will be readily appreciated, the gate trenches may as well be formed after performing the steps described herein. According to a further embodiment, the first gate trenches 212 and the second gate trenches 412 may also be formed during the process steps described herein.

First source contact grooves 321, and first drain contact grooves 322, each extending in the first direction, e.g. the y direction, are formed in the first main surface 110 in the region of the doped well portion 150 of the first conductivity type. The first source contact groove 321 and the first drain contact groove 322 may be formed using photolithographical processes as is commonly known. The extension length of the first source contact groove 321 and the first drain contact groove 322 depends on the lateral extension of the transistor that is to be formed. Further, second source contact grooves 521 and second drain contact grooves 522 are formed in the first main surface 110 of the semiconductor substrate in the region of the second layer 140 of the first conductivity type. The grooves may be formed using a patterned hard mask layer 281 such as silicon oxide formed over the first main surface 110 of the semiconductor substrate 100 as an etching mask. The grooves may be etched to the same depth or to differing depth. For example, a depth of the grooves may be approximately 0.5 to 5 μm.

FIG. 2A shows a horizontal cross-sectional view of a resulting structure. Further, FIGS. 2B and 2C show vertical cross-sectional views. For example, the cross-sectional view of FIG. 2B extends in the x direction, whereas the cross-sectional view of FIG. 2C extends in the y direction.

Thereafter, a first tilted ion implantation step may be performed. The first ion implantation step may be performed with dopants of the first conductivity type.

Generally, the direction of a tilted ion implantation step may be specified by two different angles, also referred to as "twist angle" and "tilt angle". The twist angle specifies an angle when the direction of the tilted ion implantation step is projected onto the first main surface of the semiconductor substrate 100. This is indicated in the upper portion of FIG. 3A showing a first main surface 110 of a semiconductor substrate 100. A first source contact groove 321 extends in the first direction. The direction of the first ion implantation process 600, the direction being projected on the first main surface 110, is perpendicular to the first direction. The tilt angle specifies an angle of the direction of the ion implantation with respect to a normal 105, i.e. a line perpendicular to the first main surface 110. The upper portion of FIG. 3B illustrates an example of a tilt angle $\alpha_1$ with respect to the normal 105 to the first main surface 110. Generally, within the context of the present specification, when a tilt angle is referred to, this tilt angle is to be understood as being different from 0°, so that the ion implantation process is not perpendicular but tilted with respect to the substrate surface 110.

A projection of the direction of the first ion implantation process 600 on the first main surface 110 may be perpendicular to the first direction. For example, this projection may be in the second direction, e.g. the x-direction. The first ion implantation step 600 may be such that dopants are introduced through first sidewalls of the grooves into the semiconductor substrate, the first sidewalls extending in the first direction. The implantation step may be performed as a dual mode implantation step, so as to implant both first sidewalls of the first source contact groove 321 and the first drain contact groove 322. According to an embodiment, before performing the first ion implantation step, a masking layer 160 may be formed over the second drain contact groove 522 so that sidewalls of the second drain contact groove 522 will not be doped.

The lower portion of FIG. 3A shows a horizontal cross-sectional view of a resulting structure. As is shown, the first sidewalls of the first source contact groove 321 and the first drain contact groove 322, the first sidewalls extending in the first direction, are doped with the dopants of the first conductivity type, e.g. n-type dopants. The dose of this doping step may be n1. For example, n1 may be in a range of $1E14/cm^2$ to $1E16/cm^2$. The dopants introduced into the first sidewalls of the first source contact groove 321 and the first drain contact groove 322 will form the first source region 201 and the first drain region 205. Further, due to this doping step, the first sidewalls of the second source contact groove 521, the first sidewalls extending in the first direction, are doped with the dopants of the first conductivity type, e.g. n-type dopants. Sidewalls of the second drain contact groove 522, which is masked with the masking layer 160, are not doped.

FIGS. 3B and 3C show vertical cross-sectional views of the first source contact groove 321 and the first drain contact groove 322, the second source contact groove 521 and the second drain contact groove 522. As is shown in FIG. 3C, due to the first ion implantation step 600, the bottom side of the second source contact groove 521 is doped so as to form the second body contact portion 425. Further, the first sidewalls of the second source contact grooves 521 will be doped. As is illustrated in the upper portion of FIG. 3B, the first ion implantation step 600 has a tilt angle $\alpha_1$ to the normal 105 to the first main surface 110. For example, the angle $\alpha_1$ may be smaller than 20°, e.g. 8 to 18°. In particular, the angle $\alpha_1$ is different from 0°.

According to an embodiment, the method may further comprise a further implantation step with dopants of the first conductivity type which is performed in a direction perpendicular with respect to the first ion implantation step at a smaller implantation dose and at a larger tilt angle. In more detail, the projection of the direction of this ion implantation step on the first main surface 110 is perpendicular to the second direction. Further, as is illustrated in the upper portion of FIG. 4C, the implantation process 610 is performed at a larger tilt angle $\beta_1$ than the first ion implantation step. The upper portion of FIG. 4C illustrates a tilt angle of this ion implantation step 610 to the normal 105 to the first main surface 110. The tilt angle $\beta_1$ is determined so that depending from the thickness $d_2$ of the hard mask layer 281 and the width of the second source contact grooves, second sidewalls of the second source contact groove 521 will not be doped by this doping process. For example, $\beta_1$ may be 40° or more, for example 45 to 85°. The second sidewalls extend in the second direction.

For example, the substrate may be rotated by 90° in the x-y plane around the z-axis before performing the second ion implantation step.

FIG. 4A shows horizontal cross-sectional views of the semiconductor substrate when performing this implantation step. As a result of this implantation step, the second sidewalls of the first source contact groove 321 and the first drain contact groove 322 extending in the second direction are lightly doped, the second sidewalls extending in the second direction. Further, due to the specific choice of the tilt angle, the second sidewalls of the second source contact groove 521 will not be doped. FIGS. 4B and 4C show cross-sectional views of the first field effect transistor and the second field effect transistor, respectively. As is shown, the bottom sides 155 of the second source contact groove 521 and the second drain contact groove 522 are doped. Further, the second source contact groove 521 and the second drain contact groove 522 remains unchanged with respect to FIG. 3C.

Then, a further tilted ion implantation step 620 with dopants of the second conductivity type is performed. The implantation direction of the tilted ion implantation step is such that a projection of the implantation direction on the first main surface 110 is perpendicular with respect to the second direction. As a result, dopants of the second conductivity type are introduced through the second sidewalls 153 of the first source contact grooves 321 into the semiconductor substrate 100. Further, the first drain contact grooves 322 may be covered by a mask layer 170 before performing this ion implantation process. As a result, the first drain contact grooves are not doped. Moreover, dopants of the second conductivity type are introduced through the second sidewalls of the second source contact grooves 521 and the second drain contact grooves 522 into the semiconductor substrate.

FIG. 5A shows a horizontal cross-sectional view of an example of a resulting structure. As is shown, the doped semiconductor portions at second sidewalls of the second source contact grooves form the second source regions 401. Doped semiconductor portions at the second sidewalls of the second drain contact grooves 522 form the second drain regions 405. FIG. 5B shows a vertical cross-sectional view of the first field effect transistor. As is shown, due to the doping step, the bottom portion of the first source contact groove 321 is doped to form the first body contact portion 225. Moreover, the first drain contact groove 322 is covered by a mask layer 170 and thus is not further doped by this doping step. Further, as is shown in FIG. 5C showing a cross-sectional view of the second field effect transistors, the second source region 401 is formed adjacent to a sidewall of the second source contact groove 521, and a second drain region 405 is formed adjacent to a sidewall of the second drain contact groove 522. The ion implantation process 620 may be performed at a tilt angle $\alpha_2$ with respect to the normal 105 to the first main surface 110. The tilt angle $\alpha_2$ may be such that even though the hard mask layer 281 is disposed over the first main surface 110, the sidewalls adjacent to the second source contact groove 521 and the second drain contact groove 522 will be doped. For example, the angle $\alpha_2$ may be different from 0° and may be smaller than 20°, e.g. 8 to 18°.

Thereafter, a further tilted ion implantation step 630 may be performed with dopants of the second conductivity type. For example, the dose of this implantation step may be $\beta_2$ that may be smaller than p1 and smaller than n1. A projection of the implantation direction of this ion implantation step 630 may be perpendicular to the first direction. The tilt angle $\beta_2$ of this ion implantation may be such that first sidewalls of the first source contact grooves are not implanted due to this doping step. For example, the tilt angle $\beta_2$ may be determined in dependence from a thickness $d_2$ of the hard mask layer 281 and the width of the first source contact groove so that the hard mask layer 281 shields the first sidewalls of the first source contact groove from being implanted. For example, $\beta_2$ may be 40° or more, for example 45 to 85°. For example, the substrate may be rotated by 90° in the x-y plane before performing this ion implantation step.

FIG. 6A shows a horizontal cross-sectional view of a resulting structure. As is shown, due to the special implantation angle, the first field effect transistor 200 will not be further affected. The first sidewall of the second drain contact groove 522, the first sidewall extending in the first direction, will be doped with dopants of the second conductivity type. Further, the bottom portion of the second source contact groove and the second drain contact groove 522 will be implanted with the dopants of the first conductivity type. FIG. 6B shows a vertical cross-section of a resulting structure. As is shown, FIG. 6B is approximately unchanged with respect to FIG. 5B. The upper portion of FIG. 6B illustrates a tilt angle $\beta_2$ of this implantation step 630.

FIG. 6C shows a vertical cross-sectional view of the second field effect transistor. As is shown, at the bottom portion of the second drain contact groove 522, a doped portion 154 of the first conductivity type is formed.

Thereafter, after removing the mask layer 170, a rapid thermal annealing process may be performed. For example, this process may be performed at a temperature of approximately 900 to 1100° C. for approximately 1 s to 60 s. As a result, various doped portions are formed at the sidewalls and the bottom regions of the grooves.

As is further illustrated in FIG. 7A, the first source region 201 and the first drain region 205 are defined. Further, the second source region 401 and the second drain region 405 are defined. Moreover, as is illustrated in FIG. 7B, the first body contact region 225 is formed at the bottom portion of the first source contact groove 321. Moreover, the second body contact region 425 is disposed at the bottom portion of the second source contact groove 521.

In the next step conductive material may be filled in the grooves 321, 322, 521, 522 to form the first source contact plug, the first drain contact plug 206, the second source contact plug 402 and the second drain contact plug 406. For example, this may be accomplished by forming a thin Ti/TiN barrier layer followed by filling a metal such as tungsten.

FIG. 8A shows a horizontal cross-sectional view of a resulting structure. As is shown, the conductive material for forming the source contact plug 202, the first drain contact plug 206, the second source contact plug 402 and the second drain contact plug 406 are disposed in the grooves. As is to be noted, although not explicitly described, further components of the respective transistors are formed, e.g. in previous processing steps. For example, gate electrodes may be formed, including forming gate trenches, e.g. first gate trenches and second gate trenches in the first main surface 110 of the semiconductor substrate, followed by filling a conductive material into the trenches. As is readily to be understood, these processes may have been performed before and are not shown explicitly for the sake of simplicity. According to further embodiments, these components may also be formed while forming the source contact grooves and the drain contact grooves or forming the source regions and the drain regions. Moreover, some components may be formed after performing the method as described herein. Depending on the specific requirements, some of the ion implementation steps may be dispensed with, e.g. when the body contact portion is to be implemented in a different manner or alternative doping processes are employed.

As is further illustrated in FIG. 8A, semiconductor portions adjacent to second sidewalls 153 of the first source contact groove are doped with the second conductivity type, and semiconductor portions adjacent to first sidewalls 152 of the second source contact groove are doped with the first conductivity type. Thereby, the electrical characteristics of the semiconductor device may be further improved.

Figure 9:
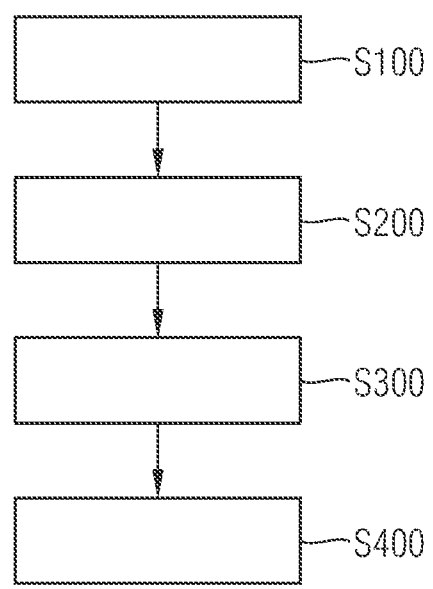
FIG. 9 summarizes a method according to an embodiment.

FIG. 9 summarizes a method according to an embodiment. As is shown, a method of forming a semiconductor device comprising a first field effect transistor and a second field effect transistor in a semiconductor substrate having a first main surface, comprises forming (S100) a first source contact groove and a first drain contact groove, each running in a first direction parallel to the first main surface, in the first main surface, forming (S200) a second source contact groove and a second drain contact groove, each running in a second direction parallel to the first main surface, in the first main surface, the second direction being different from the first direction, performing (S300) a first tilted ion implantation process with dopants of the first conductivity type in a first implantation direction, a projection of the first implantation direction on the first main surface being perpendicular to the first direction, the first implantation direction having a first tilt angle with respect to a normal to the first main surface, so as to introduce dopants through first sidewalls of the first source contact groove and the first drain contact groove into the semiconductor substrate, the first sidewalls extending in the first direction.

The method further comprises performing (S400) a second tilted ion implantation process with dopants of the second conductivity type at a second implantation direction, a projection of the second implantation direction on the first main surface being perpendicular to the second direction, the second implantation direction having a second tilt angle with respect to the normal to the first main surface so as to introduce dopants through second sidewalls of the second source contact groove and the second drain contact groove into the semiconductor substrate, the second sidewalls extending in the second direction.

As has been explained in the forgoing, the present method enables transistors of different conductivity types and comprising source contact grooves and drain contact grooves to be formed by simultaneous or joint processing steps. In particular, due to the feature that the first source/drain contact grooves extend in a direction different from the direction of the second source/drain contact grooves and by performing tilted ion implantation processes at different tilt and twist angles, the manufacture of the semiconductor device may be largely simplified. By appropriately selecting the tilt and twist angles of the ion implantation processes, the corresponding sidewalls may be doped. The present method is for example useful for manufacturing integrated circuits comprising FinFETs of different conductivity types to thereby implement a CMOS technology. Due to the presence of source contact grooves and drain contact grooves, the source and the drain regions may be contacted over an increased depth resulting in improved electrical characteristics. By using tilted ion implantation methods at different tilt and twist angles with ions of different conductivity types and contact grooves extending in different directions, the bottom portion of the contact grooves may be doped with the first conductivity type whereas the sidewalls of the contact grooves are doped with the second conductivity type and vice versa. Integrating transistors of different conductivity type in one substrate enables the implementation of interfaces and driving circuits.

The semiconductor device 1 described herein comprises a plurality of first field effect transistors 200 which may be connected in parallel and second field effect transistors 300 that may be connected in parallel. For example, the plurality of parallel first or second transistors 200, 300 may comprise a common first or second source contact or electrode 202, 402 disposed in the first or second source contact groove 321, 521 and a common first or second drain contact or electrode 206, 406 disposed in the first or second drain contact groove 322, 522. The pattern of the single transistors may be repeated and mirrored along the first and the second directions.

According to an embodiment, the first or the second semiconductor device according to an embodiment may be suitably used as a low voltage power switch or transistor, for example, a low-ohmic low voltage power switch or transistor, and the second or first field effect transistor may be employed in a logic circuitry and other as is commonly used in CMOS technology. For example, the term "low voltage" may refer to source-drain voltages of approximately up to 15V. According to a specific application, a driver circuit for driving single elements of an array, wherein the single elements are driven independently from each other at a comparable low voltage, may comprise semiconductor devices according to embodiments.

Figure 10:
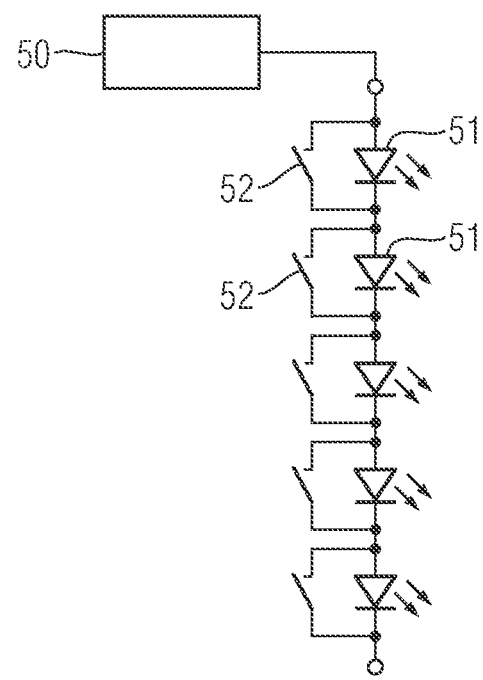
FIG. 10 shows an example of an integrated circuit according to an embodiment.

FIG. 10 shows an equivalent circuit diagram of a driver circuit for driving an array of LEDs ("light emitting diodes") 51 that are connected in series with a current regulator 50. For example, the forward voltage of such an LED 51 may be approximately 1.4V to approximately 4 V, and currents may be up to 1.5 A. The single LEDs 51 may be driven independently from each other by switches 52. The switches 52 may be implemented by first or second field effect transistors as described herein. The driver circuit for controlling the LEDs 51 may further comprise the second or first field effect transistors.

While embodiments of the invention have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. A semiconductor device, comprising a first field effect transistor and a second field effect transistor each formed in a semiconductor substrate having a first main surface,
    wherein the first field effect transistor comprises:
        a first source contact groove and a first drain contact groove, each running in a first direction parallel to the first main surface, and each being formed in the first main surface;
        first source regions of a first conductivity type electrically connected to a conductive material in the first source contact groove; and
        first drain regions of the first conductivity type electrically connected to a conductive material in the first drain contact groove,
    wherein the second field effect transistor comprises:
        a second source contact groove and a second drain contact groove, each running in a second direction parallel to the first main surface, the second direction being different from the first direction, and each being formed in the first main surface;
        second source regions of a second conductivity type electrically connected to a conductive material in the second source contact groove; and
        second drain regions electrically connected to a conductive material in the second drain contact groove.

2. The semiconductor device of claim 1, further comprising:
    first gate electrode structures and first body regions, extending between the first source contact groove and the first drain contact groove; and
    second gate electrode structures and second body regions, extending between the second source contact groove and the second drain contact groove.

3. The semiconductor device of claim 2, wherein the first body regions are of the second conductivity type and the second body regions are of the first conductivity type different from the second conductivity type.

4. The semiconductor device of claim 2, wherein the first gate electrode structures are disposed in first gate trenches in the first main surface, the first gate trenches extending in the second direction, and wherein the second gate electrode structures are disposed in second gate trenches in the first main surface, the second gate trenches extending in the first direction.

5. The semiconductor device of claim 1, further comprising first body contact portions adjacent to the first source contact groove and electrically connected to the conductive material in the first source contact groove.

6. The semiconductor device of claim 1, further comprising second body contact portions adjacent to the second source contact groove and electrically connected to the conductive material in the second source contact groove.

7. The semiconductor device of claim 1, wherein the first field effect transistor is disposed in a portion of the second conductivity type of the semiconductor substrate, and wherein the second field effect transistor is disposed in a portion of the first conductivity type of the semiconductor substrate.

8. The semiconductor device of claim 1, wherein the semiconductor device is operable as a low-voltage power transistor.

9. A driver circuit comprising the semiconductor device of claim 1.

10. The driver circuit of claim 9, wherein the driver circuit is configured to independently drive single elements of an array of elements.

* * * * *